(12) United States Patent
Place et al.

(10) Patent No.: US 9,412,907 B1
(45) Date of Patent: Aug. 9, 2016

(54) GRADED VIAS FOR LED CHIP P- AND N-CONTACTS

(71) Applicant: CREE, INC., Durham, NC (US)

(72) Inventors: Thomas Place, Franklinton, NC (US); Bennett Dean Langsdorf, Cary, NC (US)

(73) Assignee: CREE, INC., Durham, NC (US)

( * ) Notice: Subject to any disclaimer, the term of this patent is extended or adjusted under 35 U.S.C. 154(b) by 0 days.

(21) Appl. No.: 14/690,284

(22) Filed: Apr. 17, 2015

(51) Int. Cl.
*H01L 31/0256* (2006.01)
*H01L 33/38* (2010.01)
*H01L 33/08* (2010.01)

(52) U.S. Cl.
CPC .............. *H01L 33/382* (2013.01); *H01L 33/08* (2013.01)

(58) Field of Classification Search
CPC ..................................................... H01L 33/382
See application file for complete search history.

(56) References Cited

U.S. PATENT DOCUMENTS 6,831,302 B2 * 12/2004 Erchak ................... H01L 33/10
257/100
8,686,429 B2 * 4/2014 Bergmann ............ H01L 33/405
257/79

* cited by examiner

*Primary Examiner* — Marc Armand
*Assistant Examiner* — Quovaunda V Jefferson
(74) *Attorney, Agent, or Firm* — Koppel, Patrick, Hebyl & Philpott

(57) ABSTRACT

The present disclosure provides various embodiments of light emitting chips and packages with improved current spreading structures, such as non-uniform via structures or varied via structures. In some embodiments, these structures may be used to regulate current flow and current crowding in order to improve emitter efficiency and uniformity. Some embodiments of this disclosure may also refer to contact pad placement to improve current flow. In some embodiments of non-uniform via structures, the size of the vias may vary, whereas in other embodiments, the shape or spacing between the vias may vary.

36 Claims, 8 Drawing Sheets

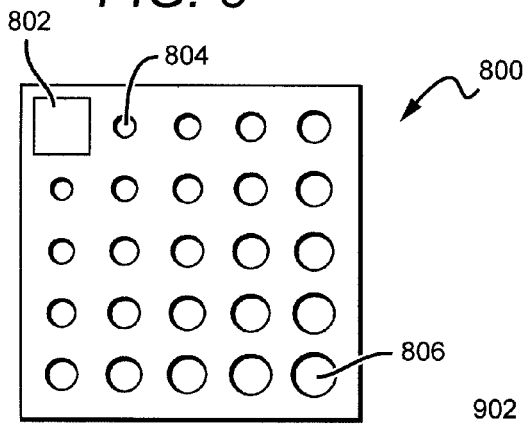
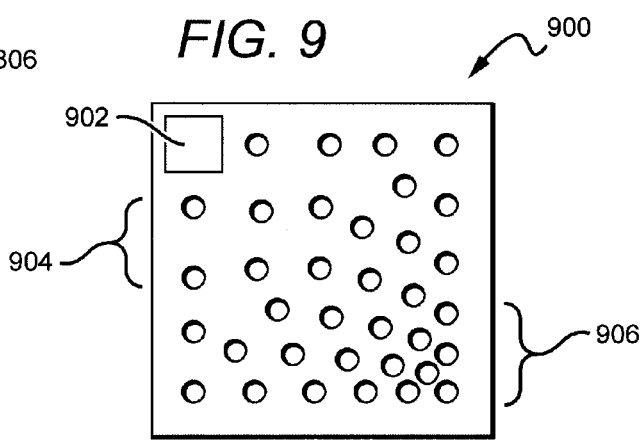
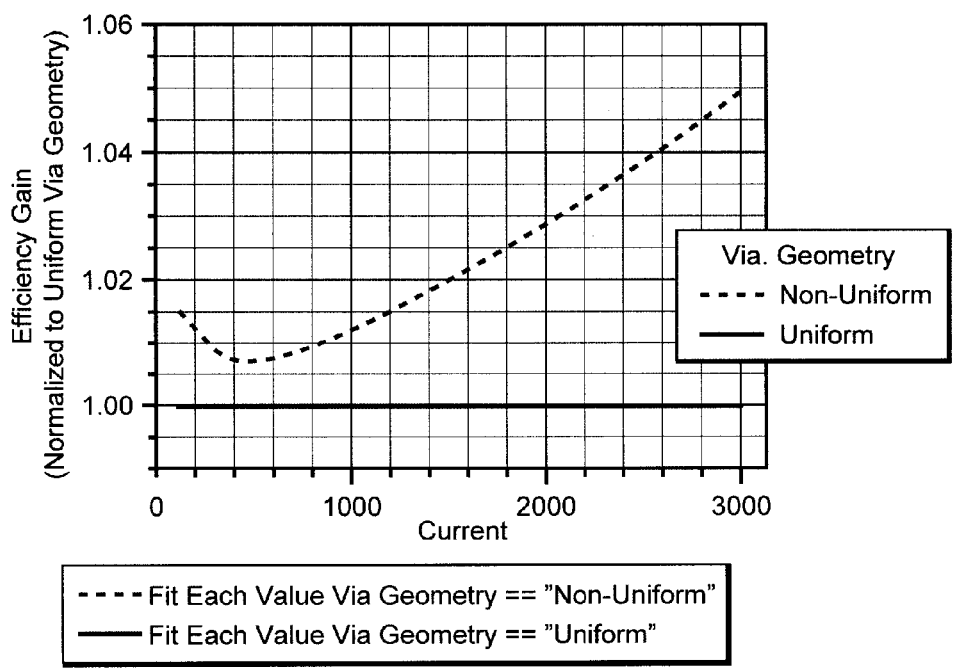

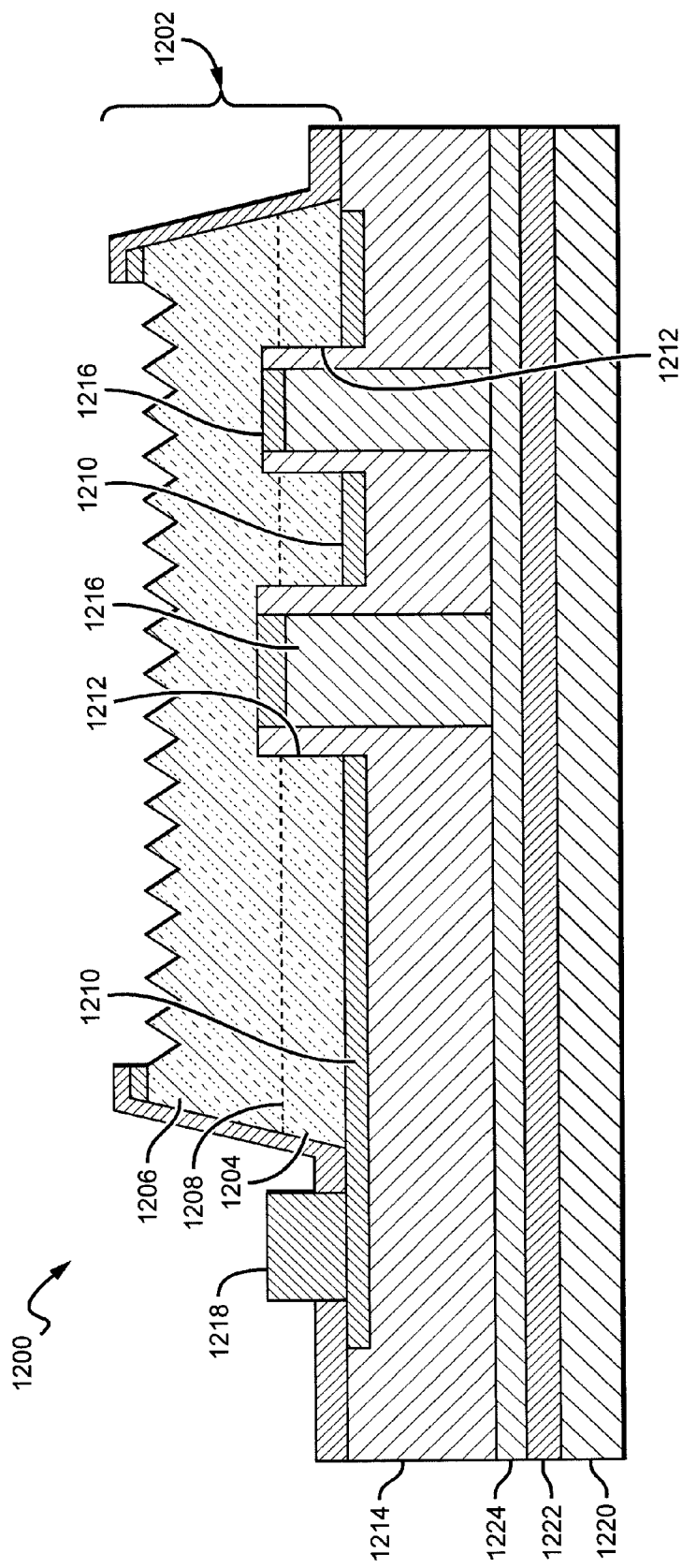

GRADED VIAS FOR LED CHIP P- AND N-CONTACTS

BACKGROUND OF THE INVENTION

1. Field of the Invention

This invention relates to light emitting diode (LED) chips and in particular to LED chips with graded or varied via sizes to control current flow.

2. Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

For typical LEDs it is desirable to operate at the highest light emission efficiency, and one way emission efficiency can be measured is by the emission intensity in relation to the input power, or lumens per watt. One way to maximize emission efficiency is by maximizing extraction of light emitted by the active region of LEDs. For conventional LEDs with a single out-coupling surface, the external quantum efficiency can be limited by total internal reflection (TIR) of light from the LED's emission region. TIR can be caused by the large difference in the refractive index between the LED's semiconductor and surrounding ambient. Some LEDs have relatively low light extraction efficiencies because of the high index of refraction of the substrate compared to the index of refraction for the surrounding material (e.g. epoxy). This difference results in a small escape cone from which light rays from the active area can transmit from the substrate into the epoxy and ultimately escape from the LED package. Light that does not escape can be absorbed in the semiconductor material or at surfaces that reflect the light. Emission inefficiencies may also be caused by poor output uniformity and/or current crowding.

Different approaches have been developed to reduce TIR and improve overall light extraction, with one of the more popular being surface texturing. Surface texturing increases the light escape probability by providing a varying surface that allows photons multiple opportunities to find an escape cone. Light that does not find an escape cone continues to experience TIR, and reflects off the textured surface at different angles until it finds an escape cone. The benefits of surface texturing have been discussed in several articles. [See Windisch et al., Impact of Texture-Enhanced Transmission on High-Efficiency Surface Textured Light Emitting Diodes, Appl. Phys. Lett., Vol. 79, No. 15, October 2001, Pgs. 2316-2317; Schnitzer et al. 30% External Quantum Efficiency From Surface Textured, Thin Film Light Emitting Diodes, Appl. Phys. Lett., Vol 64, No. 16, October 1993, Pgs. 2174-2176; Windisch et al. Light Extraction Mechanisms in High-Efficiency Surface Textured Light Emitting Diodes, IEEE Journal on Selected Topics in Quantum Electronics, Vol. 8, No. 2, March/April 2002, Pgs. 248-255; Streubel et al. High Brightness AlGaNInP Light Emitting Diodes, IEEE Journal on Selected Topics in Quantum Electronics, Vol. 8, No. March/April 2002]. Additionally, U.S. Pat. No. 6,657,236, also assigned to Cree Inc., discloses structures formed on the semiconductor layers for enhancing light extraction in LEDs.

With respect to current crowding and efficient current spreading, efforts have also been made to correct these issues. In some cases, contact sizes have been increased. In others, current spreading layers have been used to increase current spreading, uniformity and to control current crowding.

Another way to increase light extraction efficiency is to provide reflective surfaces that reflect light so that it contributes to useful emission from the LED chip or LED package. In a typical LED package 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16, which may contain a wavelength conversion material, such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected. Some light may be absorbed by the reflector cup due to the less than 100% reflectivity of practical reflector surfaces. Some metals can have less than 95% reflectivity in the wavelength range of interest.

FIG. 2 shows another conventional LED package 20 that may be more suited for high power operations that can generate more heat. In the LED package 20, one or more LED chips 22 are mounted onto a carrier, such as a printed circuit board (PCB) carrier, substrate or submount 23. A reflector 24 can be included on the submount 23 that surrounds the LED chip(s) 22 and reflects light emitted by the LED chips 22 away from the package 20. Different reflectors can be used, such as metal reflectors, omni-directional reflectors (ODRs), and distributed Bragg reflectors (DBRs). The reflector 24 can also provide mechanical protection to the LED chips 22. One or more wirebond connections 11 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

The reflectors shown in FIGS. 1 and 2 are arranged to reflect light that escapes from the LED. LEDs have also been developed having internal reflective surfaces to reflect light internal to the LEDs. FIG. 3 shows a schematic of an LED chip 30 with an LED 32 mounted on a submount 34 by a metal bond layer 36. The LED further comprises a p-contact/reflector 38 between the LED 32 and the metal bond 36, with the reflector 38 typically comprising a metal, such as silver (Ag). This arrangement is utilized in commercially available LEDs, such as those from Cree® Inc., available under the EZBright™ family of LEDs. The reflector 38 can reflect light emitted from the LED chip toward the submount back toward the LED's primary emitting surface. The reflector also reflects TIR light back toward the LED's primary emitting surface. Like the metal reflectors above, reflector 38 reflects less than 100% of light and in some cases less than 95%. The reflectivity of a metal film on a semiconductor layer may be calculated from the materials' optical constants using thin film design software such as TFCalc™ from Software Spectra, Inc. (www.sspectra.com). U.S. Pat. No. 7,915,629, also assigned to Cree Inc. and fully incorporated herein by reference, further discloses a higher efficiency LED having a composite high reflectivity layer integral to the LED for improving emission efficiency.

In LED chips having a mirror contact to enhance reflectivity (e.g. U.S. Patent Publication No. 2009/0283787, which is incorporated in its entirety herein by reference), the light extraction and external quantum efficiency (EQE) is strongly affected by the reflectivity of the mirror. For example, in a mirror comprised of Ni/Ag, the reflectivity is dominated by the properties of the Ag, which is >90% reflective. However, such a mirror is traditionally bordered by a metal barrier layer that encompasses the edges of the mirror, with the barrier layer provided to prevent Ag migration during operation. The metal barrier layer has much lower reflectivity than the mirror (e.g. 50% or lower), and the portions of the barrier layer contacting the active layer outside the mirror periphery can have a negative effect on the overall efficiency of the LED chip. This is because such portions of the metal barrier layer absorb many of the photons that would otherwise exit the chip.

FIG. 4 depicts a monolithic LED chip 40 comprising a plurality of sub-LEDs and a plurality of contact vias 42. As it can be seen, all the vias are equally spaced and equally sized. At high currents, and as die sizes increase, the current spreading capability starts to suffer across the chip. Current flows from a contact 46, to the various vias. As the vias are equally spaced and equally sized, current flows where it is easiest, causing current crowding in the vias closer to the contact 46. Therefore, the active layers are not efficiently used. This both impacts near-field emission uniformity and loss of efficiency because localized current density in areas of the chip where current typically "crowds." It is desirable to improve current spreading, reduce current crowding, and thereby increase emitter efficiency and uniformity.

SUMMARY OF THE INVENTION

The present disclosure provides various embodiments of light emitting chips and packages with non-uniform vias structures, such that these structures may be used to regulate current flow and current crowding in order to improve emitter efficiency and uniformity.

One embodiment according to the present disclosure describes light emitting diode (LED) chip, comprising an active LED structure with an active layer between two oppositely doped epitaxial layers. This active layer emits light in response to an electrical signal applied to the oppositely doped layers. Additionally, this chip also comprises a plurality of non-uniform vias providing an electrical path to at least one of said oppositely doped layers, wherein the non-uniform vias protrude into at least one of said oppositely doped epitaxial layers.

Another embodiment according to the present disclosure describes a LED chip, comprising an active region comprised of an n-type layer and a p-type layer. The chip also includes a plurality of non-uniform vias protruding through the p-type layer and in contact with the n-type layer.

Yet another embodiment according to the present disclosure describes a light emitting diode (LED) chip, comprising an active LED structure comprising an active region between two oppositely doped epitaxial layers. This active region emits light in response to an electrical signal applied to the oppositely doped layers.

Additionally, the chip includes a plurality of non-uniform vias providing an electrical path to one of the oppositely doped layers and the LED chip has an improved light emission efficiency or uniformity compared to a similar LED with a uniform via structure.

A better understanding of the features and advantages of the present embodiments will be obtained by reference to the following detailed description of the invention and accompanying drawings, which set forth illustrative embodiments in which the principles of the invention are utilized.

BRIEF DESCRIPTION OF THE DRAWINGS

FIG. 8 is a top view of an embodiment of a via structure of an LED chip according to the present disclosure;
FIG. 9 is a top view of an embodiment of a via structure of an LED chip according to the present disclosure;
FIG. 11 is a graph relating to efficiency gains of emitters according to embodiments of the present disclosure;
FIG. 12 is a sectional view of another embodiment of an LED chip according to the present disclosure.

DETAILED DESCRIPTION OF THE INVENTION

Figure 1:
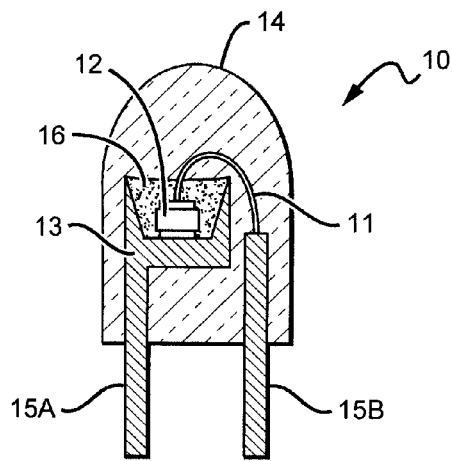
FIG. 1 is a sectional view of a prior art LED package.
Figure 2:
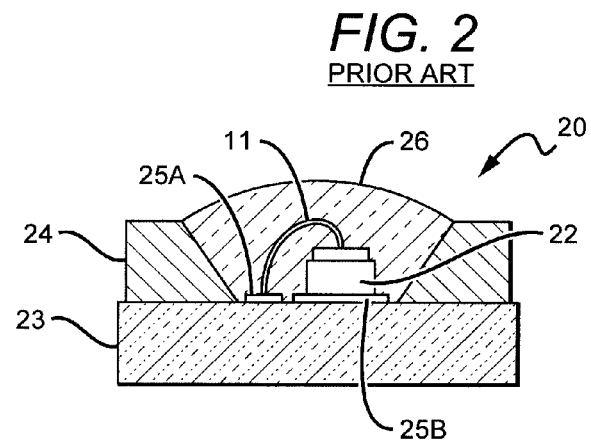
FIG. 2 is a sectional view of another prior art LED package.
Figure 3:
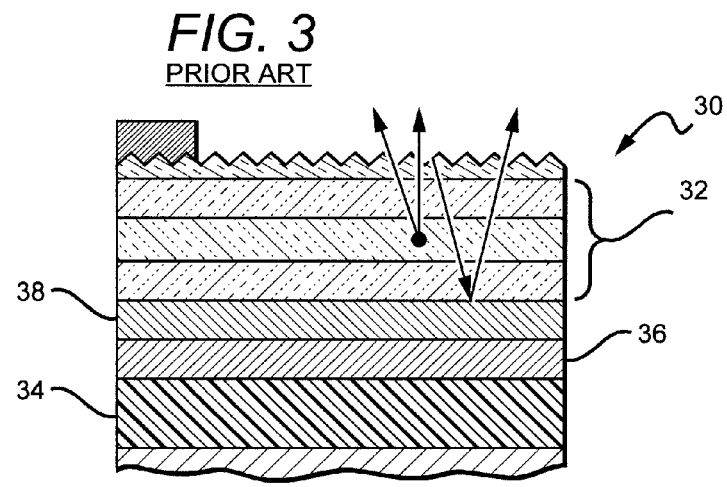
FIG. 3 a sectional view of another embodiment of a prior art LED chip.
Figure 4:
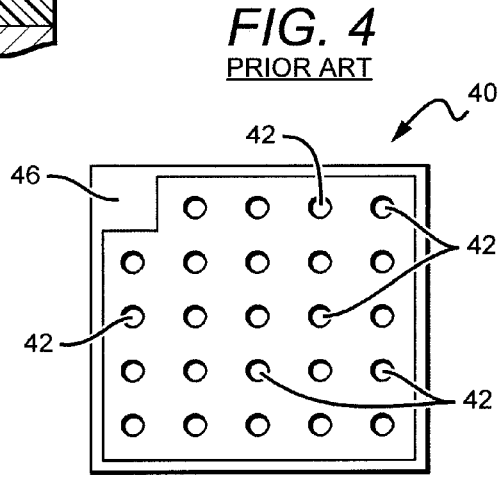
FIG. 4 is a top view of a prior art monolithic LED chip according to the present invention.

Embodiments of the present invention provide improved light emitting devices and packages and methods for fabricating the same, wherein the improvements may allow for improved efficiency and uniformity.

The present disclosure will now set forth detailed descriptions of various embodiments. These embodiments provide methods and devices pertaining to solid state devices, such as light emitting devices, various light emitters, LED chips, LED wafers, LED components, and methods of manufacture thereof. Embodiments incorporating features of the present disclosure allow for the creation of devices with efficient or improved light emission or output. These embodiments may incorporate improved current spreading structures, such as non-uniform via structures or varied via structures. Some embodiments of this disclosure may also refer to contact pad placement to improve current flow.

Different embodiments of light emitting diode (LED) chips according to the present disclosure comprise an active LED structure having an active layer between two oppositely doped epitaxial layers. Vias are disposed within the LED chip providing current paths from contacts to the epitaxial layers. Grading or varying the size or density of vias connected to P- or N-side contacts modifies the current path through the LED junction. This may force higher localized current density in areas with larger contact to the epitaxial layers. The size of the via or number of vias disposed in an area effectively determines the resistance of the path the current has to follow. Given two contacts, increasing the size of one via will decrease resistance, causing more current to flow through the larger contact than the small. Similarly, increasing the density of the number of vias in an area will also decrease resistance in that area.

At high currents and as chip die sizes increase the current spreading capability starts to suffer across the chip. Therefore, modifying current flow paths to encourage or force current to flow throw specific areas can increase emitter efficiency and uniformity. For example, grading the vias, such that the overall size or density of the vias are non-uniform, helps "force" current to flow through specific areas of the chip to make the emitting surface more uniform and more efficiently use the available epitaxial area. This both improves near-field emission uniformity and improves efficiency by reducing the localized current density in areas of the chip where current typically "crowds." This effect may also be achieved by varying contact locations and current spreading layer thicknesses, such that the thickness is non-uniform. Thereby, the present disclosure discusses making via layouts variable, non-uniform, or asymmetric instead of using a constant diameter and pitch. Doing so removes the constraint of relying solely on wafer fabrication processes for the P- and N-side contacts to improve current spreading, allowing greater freedom in tuning chip design for specific applications and improving efficiency.

In the description that follows, numerous details are set forth in order to provide a thorough understanding of the invention. It will be appreciated by those skilled in the art that variations of these specific details are possible, while still achieving the results of the invention. Well-known elements and processing steps are generally not described in detail in order to avoid unnecessarily obscuring the description of the invention.

Throughout this description, the preferred embodiment and examples illustrated should be considered as exemplars, rather than as limitations on the present invention. As used herein, the term "invention," "device," "method," "present invention," "present device" or "present method" refers to any one of the embodiments of the invention described herein, and any equivalents. Furthermore, reference to various feature(s) of the "invention," "device," "method," "present invention," "present device" or "present method" throughout this document does not mean that all claimed embodiments or methods must include the referenced feature(s).

It is also understood that when an element or feature is referred to as being "on" or "adjacent" to another element or feature, it can be directly on or adjacent the other element or feature or intervening elements or features may also be present. It is also understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "outer", "above", "lower", "below", "horizontal," "vertical" and similar terms, may be used herein to describe a relationship of one feature to another. It is understood that these terms are intended to encompass different orientations in addition to the orientation depicted in the figures.

It is understood that when a first element is referred to as being "between," "sandwiched," or "sandwiched between," two or more other elements, the first element can be directly between the two or more other elements or intervening elements can also be present between the two or more other elements. For example, if a first layer is "between" or "sandwiched between" a second and third layer, the first layer can be directly between the second and third layers with no intervening elements or the first layer can be adjacent to one or more additional layers with the first layer and these additional layers all between the second and third layers.

Although the terms first, second, etc. may be used herein to describe various elements or components, these elements or components should not be limited by these terms. These terms are only used to distinguish one element or component from another element or component. Thus, a first element or component discussed below could be termed a second element or component without departing from the teachings of the present invention. As used herein, the term "and/or" includes any and all combinations of one or more of the associated list items.

The terminology used herein is for describing particular embodiments only and is not intended to be limiting of the invention. As used herein, the singular forms "a," "an," and "the" are intended to include the plural forms as well, unless the context clearly indicates otherwise. It will be further understood that the terms "comprises," "comprising," when used herein, specify the presence of stated features, integers, steps, operations, elements, and/or components, but do not preclude the presence or addition of one or more other features, integers, steps, operations, elements, components, and/or groups thereof.

It is noted that the terms "layer" and "layers" are used interchangeably throughout the application. A person of ordinary skill in the art will understand that a single "layer" of material may actually comprise several individual layers of material. Likewise, several "layers" of material may be considered functionally as a single layer. In other words the term "layer" does not denote a homogenous layer of material. A single "layer" may contain various material concentrations and compositions that are localized in sub-layers. These sub-layers may be formed in a single formation step or in multiple steps. Unless specifically stated otherwise, it is not intended to limit the scope of the invention as embodied in the claims by describing an element as comprising a "layer" or "layers" of material.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein, but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

LED structures, features, and their fabrication and operation are generally known in the art and only briefly discussed herein. LEDs can have many different semiconductor layers arranged in different ways and can emit different colors. The layers of the LEDs can be fabricated using known processes, with a suitable process being fabrication using metal organic chemical vapor deposition (MOCVD). The layers of the LED chips generally comprise an active layer/region sandwiched between first and second oppositely doped epitaxial layers, all of which are formed successively on a growth substrate or wafer. LED chips formed on a wafer can be singulated and used in different applications, such as mounting in a package. It is understood that the growth substrate/wafer can remain as part of the final singulated LED or the growth substrate can be fully or partially removed.

It is also understood that additional layers and elements can also be included in the LEDs, including but not limited to buffer, nucleation, contact and current spreading layers, as well as light extraction layers and elements. The active region can comprise single quantum well (SQW), multiple quantum well (MQW), double heterostructure or super lattice structures.

The active region and doped layers may be fabricated from different material systems, with one such system being Group-III nitride based material systems. Group-III nitrides refer to those semiconductor compounds formed between nitrogen and the elements in the Group III of the periodic table, usually aluminum (Al), gallium (Ga) and indium (In). The term also refers to ternary and quaternary compounds, such as aluminum gallium nitride (AlGaN) and aluminum indium gallium nitride (AlInGaN). In a possible embodiment, the doped layers are gallium nitride (GaN) and the active region is InGaN. In alternative embodiments, the doped layers may be AlGaN, aluminum gallium arsenide (AlGaAs) or aluminum gallium indium arsenide phosphide (AlGaInAsP) or aluminum indium gallium phosphide (AlInGaP) or zinc oxide (ZnO).

The growth substrate/wafer can be made of many materials, such as silicon, glass, sapphire, silicon carbide, aluminum nitride (AlN), gallium nitride (GaN), with a suitable substrate being a 4H polytype of silicon carbide, although other silicon carbide polytypes can also be used, including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity, so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature, as well as in a U.S. Pat. Nos. Re. 34,861; 4,946,547; and 5,200,022.

LED devices may also include a submount. Submounts can be formed of many different materials, such as silicon, ceramic, alumina, aluminum nitride, silicon carbide, sapphire, or a polymeric material, such as polymide and polyester, etc. In other embodiments, the submount can include a highly reflective material, such as reflective ceramics, dielectrics or metal reflectors like silver, to enhance light extraction from the component. In some embodiments, the submount may be a flat ceramic submount. In other embodiments, the submount can comprise a printed circuit board (PCB), or any other suitable material, such as T-Clad thermal clad insulated substrate material, available from The Bergquist Company of Chanhassen, Minn. For PCB embodiments, different PCB types can be used, such as standard FR-4 metal core PCB, or any other type of printed circuit board. In yet other embodiments, the emitter package may include a leadframe, such that a light emitter may be mounted to a surface of the leadframe.

LEDs can also comprise additional features, such as conductive current spreading structures, current spreading layers, and wire bond pads, all of which can be made of known materials deposited using known methods. Some or all of the LEDs can be coated with one or more phosphors, with the phosphors absorbing at least some of the LED light and emitting a different wavelength of light, such that the LED emits a combination of light from the LED and the phosphor. LED chips can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. Alternatively, the LEDs can be coated using other methods, such as electrophoretic deposition (EPD), with a suitable EPD method described in U.S. patent application Ser. No. 11/473,089 entitled "System For and Method For Closed Loop Electrophoretic Deposition of Phosphor Materials On Semiconductor Devices", which is also incorporated herein by reference.

LEDs may incorporate a reflector, which can be any reflective material known in the art for use with light emitting devices, including but not limited to white matrix materials, silver, diffuse reflectors, such as materials comprising a reflective white color, and thin film reflectors, such as metals or dielectric layers. The reflector can also be made of various materials known in the art for use as contacts that also happen to be reflective, for example, various metals. These types of dielectric mirrors are described in detail in U.S. patent application Ser. No. 13/909,927 to Sten Heikman, et al., entitled "Light Emitting Diode Dielectric Mirror", filed on Jun. 4, 2013, which is incorporated herein in its entirety by reference. Some embodiments of light emitter components according to the present disclosure utilize a reflective material, such as a white diffusive paint or coating, metal reflector, or other type of reflective surface, to further improve light extraction and emission uniformity. This reflective layer may be applied to, and form a portion of, the bottom or mounting surface of the device. The use of white reflective materials on a surface is generally described in U.S. patent application Ser. No. 14/201,490 to Bhat, et al., entitled "Wafer Level Contact Pad Standoffs With Integrated Reflector," which is incorporated herein in its entirety by reference, including the drawings, schematics, diagrams, and related written description. Though the teachings of this reference may relate to the bottom, contact, or mounting side of a device, it should be understood that in the present disclosure, these techniques and materials may be added to the surface of a component below an emitter, which the emitter is mounted over. Therefore, the reflective surface may act to increase extraction of light, which is reflected back towards the device by the encapsulant or encapsulant to air interface.

Additionally, some LEDs may include light extraction features, which can comprise a material that facilitates the directing, scattering, focusing, and/or otherwise altering the direction and/or nature of, light emitted from the active region. For example, the light extraction feature can comprise a material with reflective or lens-like properties (e.g., focusing or changing the direction of incoming light). The light extraction feature can comprise a material different than the material of the diode region. The light extraction feature can comprise any dielectric material, for example, $SiO_2$, silicone, or air. In some embodiments, the light extraction feature can comprise a material having a lower index of refraction than the material of the surrounding diode region, this index difference can cause TIR for light incident at sufficiently high angles, resulting in the direction of the light being altered.

Furthermore, LEDs may have vertical or lateral geometry as is known in the art. Those comprising a vertical geometry may have a first contact on a substrate and a second contact on a p-type layer. An electrical signal applied to the first contact spreads into the n-type layer and a signal applied to the second contact spreads into a p-type layer. In the case of Group-III nitride devices, it is well known that a thin semitransparent typically covers some or the entire p-type layer. It is understood that the second contact can include such a layer, which is typically a metal, such as platinum (Pt) or a transparent conductive oxide, such as indium tin oxide (ITO). In some embodiments, the thickness of this thin semitransparent electrically conductive layer may be varied. However, there may be limits to the variations, which are possible in this layer as some levels of variations may cause cracking. Therefore, modification of vias, such as n-contact vias, may be more desirable to compensate for current flow corrections.

LEDs may also comprise a lateral geometry, wherein both contacts are on the top of the LEDs. A portion of the p-type layer and active region is removed, such as by etching, to expose a contact mesa on the n-type layer. A second lateral n-type contact is provided on the mesa of the n-type layer. The contacts can comprise known materials deposited using known deposition techniques. Many different LEDs can be used with embodiments incorporating features of the present invention, such as those commercially available from Cree Inc. of Durham, N.C., under its DA, EZ, GaN, MB, RT, TR, UT and XT families of LED chips.

LEDs may use a conversion material as a part of the device or over the LED, to convert the wavelength of the output light. Many different phosphors can be used on LEDs or in encapsulants according to the present invention being particularly adapted to lamps emitting white light. Light sources used in embodiments of the present invention can be LED based with at least some, and in some embodiments all, of the LEDs emitting light in the blue wavelength spectrum. The phosphor layer can absorb some of the blue light and re-emit yellow. This allows the lamp to emit a white light combination of blue and yellow light. In some embodiments, the blue LED light can be converted by a yellow conversion material using a commercially available YAG:Ce phosphor, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for creating white light when used with a blue emitting LED based emitter include, but are not limited to:

$Tb_{3-x}RE_xO_{12}$:Ce(TAG); RE=Y, Gd, La, Lu; or
$Sr_{2-x-y}Ba_xCa_ySiO_4$:Eu.

Some arrangements according to the present invention can utilize multiple phosphors, such as two or more phosphors mixed in together or in separate sections. In some embodiments, each of the two phosphors can absorb the LED light and can re-emit different colors of light. In these embodiments, the colors from the two phosphor layers can be combined for higher CRI white of different white hue (warm white). This can include light from yellow phosphors above that can be combined with light from red phosphors. Different red phosphors can be used including:

$Sr_xCa_{1-x}$S:Eu, Y; Y=halide;
$CaSiAlN_3$:Eu; or
$Sr_{2-y}Ca_ySiO_4$:Eu

Other phosphors can be used to create color emission by converting substantially all light to a particular color. For example, the following phosphors can be used to generate green light:

$SrGa_2S_4$:Eu;
$Sr_{2-y}Ba_ySiO_4$:Eu; or
$SrSi_2O_2N_2$:Eu.

The following lists some additional suitable phosphors that can be used as conversion particles, although others can be used. Each exhibits excitation in the blue and/or UV emission spectrum, provides a desirable peak emission, has efficient light conversion, and has acceptable Stokes shift:

Yellow/Green
$(Sr,Ca,Ba)(Al,Ga)_2S_4$:Eu$^{2+}$
$Ba_2(Mg,Zn)Si_2O_7$:Eu$^{2+}$
$Gd_{0.46}Sr_{0.31}Al1.23O_xF_{1.38}$:EU$^{2+}{}_{0.06}$
$(Ba_{1-x-y}Sr_xCa_y)SiO_4$:Eu
$Ba_2SiO_4$:Eu$^{2+}$
$Lu_3Al_5O_{12}$ doped with Ce$^{3+}$
$(Ca,Sr,Ba)Si_2O_2N_2$ doped with Eu$^{2+}$
$CaSc2O4$:Ce$^{3+}$
$(Sr,Ba)2SiO4$:Eu$^{2+}$
RED
$Lu_2O_3$:Eu$^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$SrTiO_3$:Pr$^{3+}$,Ga$^{3+}$
$CaAlSiN_3$:Eu$^{2+}$
$Sr_2Si_5N_8$:Eu$^{2+}$ Different sized phosphor particles can be used including, but not limited to particles in the range of 10 nanometers (nm) to 30 micrometers (µm), or larger. Smaller particle sizes typically scatter and mix colors better than larger sized particles to provide a more uniform light. Larger particles are typically more efficient at converting light compared to smaller particles, but emit a less uniform light.

The converter can comprise one or multiple layers of different phosphor materials, with some multiple layer arrangements described in commonly assigned U.S. patent application Ser. No. 13/029,063 to Hussell et al. and entitled "High Efficiency LED Lamp With Remote Phosphor and Diffuser Configuration," which is fully incorporated by reference herein in its entirety.

Different embodiments of packages according to the invention can also comprise different types and arrangements of scattering particles or scatterers. Some exemplary scattering particles include:

silica gel;
zinc oxide (ZnO);
yttrium oxide ($Y_2O_3$);
titanium dioxide ($TiO_2$);
barium sulfate ($BaSO_4$);
alumina ($Al_2O_3$);
fused silica ($SiO_2$);
fumed silica ($SiO_2$);
aluminum nitride;
glass beads;
zirconium dioxide ($ZrO_2$);
silicon carbide (SiC);
tantalum oxide ($TaO_5$);
silicon nitride ($Si_3N_4$);
niobium oxide ($Nb_2O_5$);
boron nitride (BN); and
phosphor particles (e.g., YAG:Ce, BOSE)

Other materials not listed may also be used. Various combinations of materials or combinations of different forms of the same material can also be used to achieve a particular scattering effect. For example, in one embodiment a first plurality of scattering particles includes alumina and a second plurality of scattering particles includes titanium dioxide. In other embodiments, more than two types of scattering particles are used. Scattering particles are discussed generally in the commonly assigned applications U.S. patent application Ser. No. 11/818,818 to Chakraborty et al. and entitled "Encapsulant with Scatterer to Tailor Spatial Emission Pattern and Color Uniformity in Light Emitting Diodes," and U.S. patent application Ser. No. 11/895,573 to Chakraborty and entitled "Light Emitting Device Packages Using Light Scattering Particles of Different Size," each of which is fully incorporated by reference herein in its entirety.

Encapsulants can have different sections of opaqueness and clearness. For example, particles used in embodiments of the present invention, including but not limited to wavelength conversion particles, phosphor particles, scattering particles, and quantum dots, can be distributed in different regions with different types of particles and/or different concentrations of particles. Encapsulants having different particle regions are described in U.S. patent application Ser. No. 12/498,253 to Le Toquin and entitled "LED Packages with Scattering Particle Regions," and U.S. patent application Ser. No. 13/902,080 to Lowes et al. and entitled "Emitter Package with Integrated Mixing Chamber," each of which is commonly assigned with the present application and each of which is fully incorporated by reference herein in its entirety.

Previously, most emitters rely on n- and p-pads to be well balanced entry or through points of current. The pads are then connected to an evenly spread and sized grid of vias irrespective of where the pads are, with no compensation for current crowding. In the present disclosure, embodiments are discussed where it is attempted to control, change and/or even out current density, thereby improving emitter uniformity, efficiency and benefiting near field emissions and emitter efficiency.

FIGS. 5A-7B show various examples of non-uniform via structures and the effect of the via structure variations on current flow. Shown are three exemplary chip designs with modified N-via diameters in specific locations on the die. The figure following each design sketch is a near-field image of the die at nominal drive current showing how the design affects the current flow and "current crowding." It should be understood that the exemplary via sizes and dispositions shown in these figures are examples of non-uniform patterns and that additional variances of these patterns may be used in practice to tune the current flow of particular die. In some embodiments, the variance of the via layout may be graded and/or random.

Figures 5A, 5B, 6A, 6B, 7A, 7B:
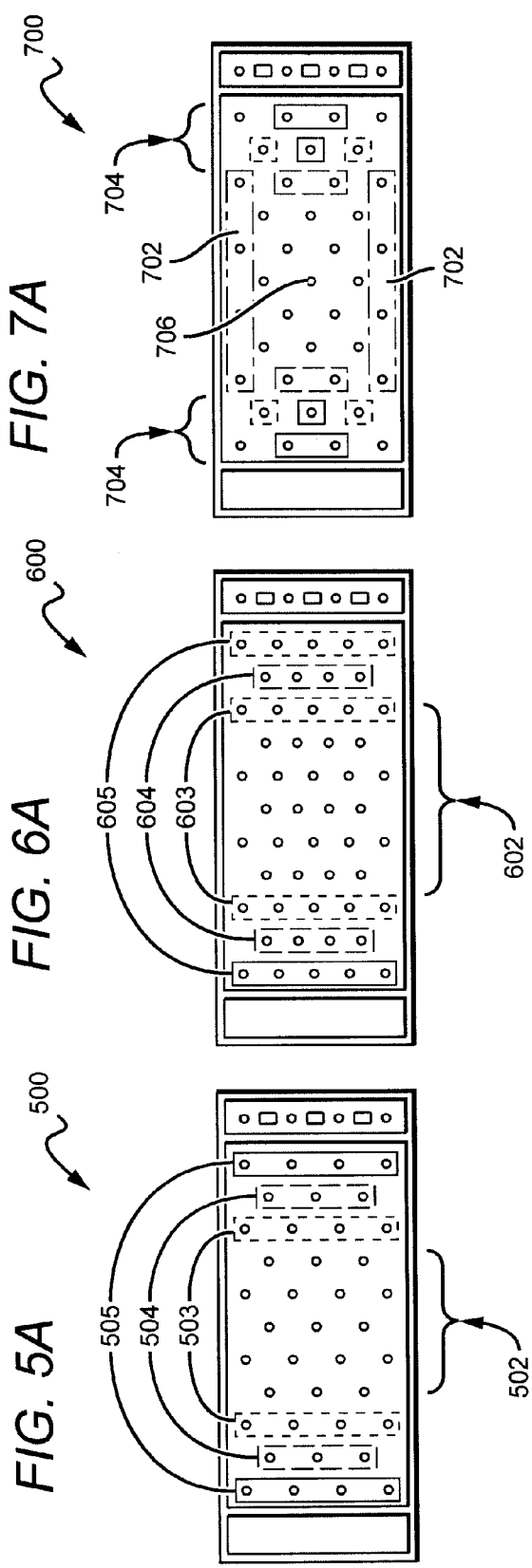
FIG. 5A is a top view of an embodiment of a via structure within an LED chip according to the present disclosure.
FIG. 5B is a near-field image of the chip of FIG. 5A.
FIG. 6A is a top view of an embodiment of a via structure within an LED chip according to the present disclosure.
FIG. 6B is a near-field image of the chip of FIG. 6A.
FIG. 7A is a top view of an embodiment of a via structure within an LED chip according to the present disclosure.
FIG. 7B is a near-field image of the chip of FIG. 7A.

FIG. 5A shows a top down view of one embodiment of an emitter 500 with a non-uniform via structure. As shown, the via sizes in this arrangement have been reduced near the edges, in order to encourage current to flow to the center of the device. The center includes vias with a diameter of 20 μm 502. The remaining vias have sizes of μm 503, 18 μm 504, and 17 μm 505, decreasing with proximity to the edges of the emitter. This type of configuration may be helpful if bond pads are situated near the ends of the emitter. It should be understood that these are exemplary numbers, and vias of any size may be used. However, the number and density of the vias must be balanced with light emission output goals as vias, which contact the n layer, remove usable epitaxial emissions area.

FIG. 5B is a near-field image of the emitter 500 design shown in FIG. 5A, showing how the design impacts current crowding at a nominal drive current. As shown, more current flow is seen in the center of the device, where the vias are larger. The configuration shown in FIGS. 5A and 5B (and subsequently in FIGS. 6A-7B) are merely exemplary to show how different configurations may impact current flow and current crowding. It should be understood that the non-uniform vias may be arranged in any pattern or without a discernable pattern, in order to impact current flow in desired particular way. The non-uniform via pattern may be related to contact pad placement and emitter structure.

FIG. 6A shows a top down view of another embodiment of an emitter 600 with a non-uniform via structure. As shown, the via sizes in this arrangement have been increased near the edges, in order to encourage current to flow to the outside of the device. The center includes vias with a diameter of 13 μm 602. The remaining vias have sizes of 14 μm 603, 15 μm 604, and 16 μm 605, increasing with proximity to the edges of the emitter. This type of configuration may be helpful if current crowding exists in the center of a device. This type of configuration may also be helpful to minimize the gap between multiple junctions of a multi-junction emitter. In other embodiments incorporating the use of a multi-junction emitters vias may be non-uniform within at least one junction of the multi-junctions. In yet other multi-junction embodiments, the vias of a 1st junction of the multi-junction are non-uniform with respect to vias of a 2nd junction of the multi-junction. In these, embodiments, the vias may be uniform within a single junction but non-uniform when compared to one another.

As with all embodiments disclosed herein, it should be understood that these are exemplary numbers, and vias of any size may be used. FIG. 6B is a near-field image of the emitter 600 design shown in FIG. 6A, showing how the design impacts current crowding at a nominal drive current. As shown, more current flow is seen near the left and right edges of the device, where the vias are larger.

FIG. 7A shows a top down view of another embodiment of an emitter 700 with a non-uniform via structure. As shown, the via sizes in this arrangement have been increased near the top and bottom edges 702, in order to encourage current to flow to the outside of the device, and decreased near the side edges 704. The center includes vias with a diameter of 20 μm 706. The remaining vias have sizes of 19 μm, 18 μm, and 17 μm, decreasing with proximity to the left and right edges of the emitter, and 22 μm, increasing toward the top and bottom of the emitter. As with all embodiments disclosed herein, it should be understood that these are exemplary numbers, and vias of any size may be used. FIG. 7B is a near-field image of the emitter design shown in FIG. 7A, showing how the design impacts current crowding at a nominal drive current. As shown, more current flow is seen near the center, top and bottom of the device, where the vias are larger.

FIG. 8 shows a top down view of an embodiment of a vertical geometry emitter 800 with a non-uniform via structure or grid. The vias 804, 806, are arranged such that the size of the vias furthest 806 from the contact pad 802 are larger than those vias closest 804 to the contact pad 802. As shown, the vias are non-uniform in size. The vias are arranged such that the smaller vias, with a higher resistance, are closer to the contact pad, whereas the larger vias, with a lower resistance, are further away from the contact pad. The difference in resistance allows for the current to flow more evenly throughout the device and reduces current crowding.

FIG. 9 shows a top down view of another embodiment of an emitter 900 with a non-uniform via structure or grid. The vias 904, 906, are arranged such that the density of the vias increases in a direction away from the contact pad 902. As shown, the vias are non-uniform in density. The vias are arranged such that the vias are farther apart 904, with a higher resistance, closer to the contact pad, whereas the vias arranged closer together 906, with a lower resistance, are farther away from the contact pad. The difference in resistance allows for the current to flow more evenly throughout the device and reduce current crowding. Although FIGS. 8 and 9 show only one contact pad, it is understood that other configurations may be used, including more contact pads or contact pads arranged in different locations. Additionally, though the vias shown are meant to protrude through at least an epitaxial layer to contact an n-layer; the same concepts can correspond to vias which contact the p-layer.

Figure 10A:
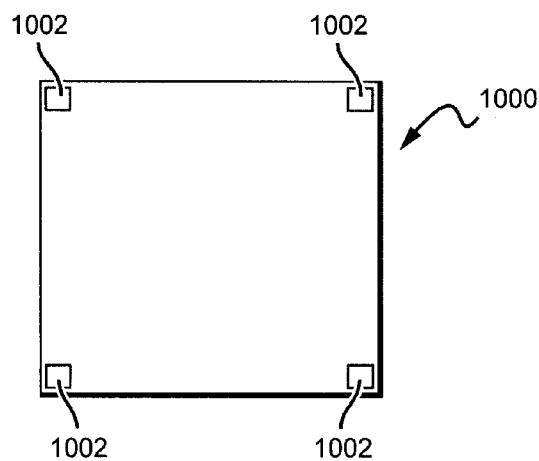
FIG. 10A-10E are a top view of various embodiments of contact pad placement of an LED chip according to the present disclosure.
Figure 10B:
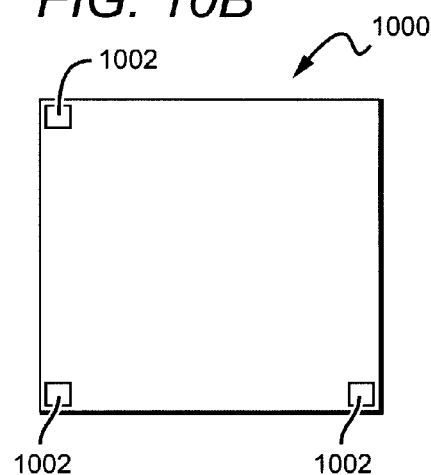
Figure 10C:
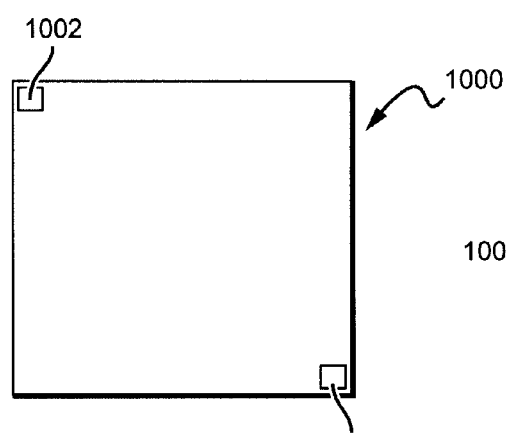
Figure 10D:
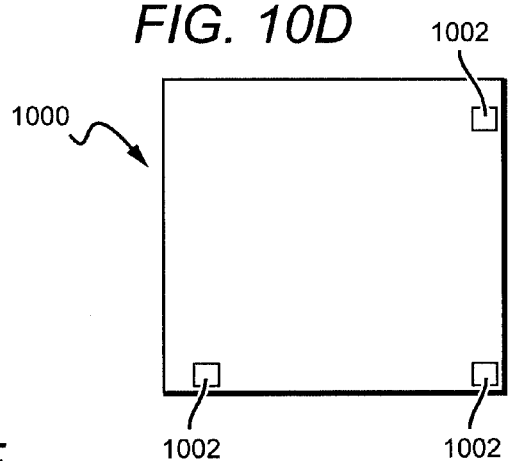
Figure 10E:
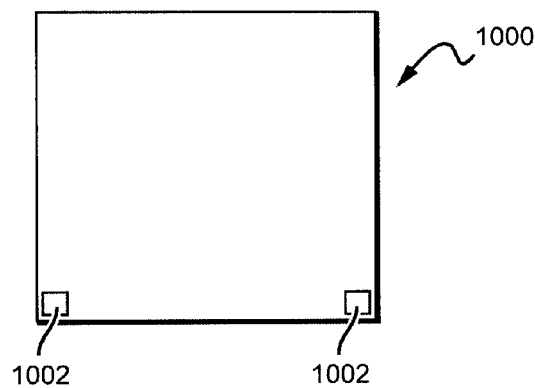

FIGS. 10A-10E shows top views of various embodiments of emitters according to the present disclosure with various contact pad configurations. Varying contact pad locations, like varying via size, can impact current flow. The FIGS. 10A-10E show an emitter 1000 and various contact pads 1002. In FIG. 10A, there are 4 p-contact pads, each of which is arranged in one corner. In FIG. 10B, three contact pads are shown. FIG. 10O shows two contact pads in opposing corners. FIG. 10D shows an emitter 1000 with three contact pads, such that two of the contact pads are moved in from the corner, rather than being at the immediate edge. Lastly, FIG. 10E shows an emitter 1000 with two contact pads on a single side. These are various examples of contact pad arrangements; however, it should be understood that any number of contact pads may be placed anywhere on the emitter, in order to influence current flow in a particular manner, preferably to improve emitter efficiency and uniformity. Additionally, it should be noted that the number of placement of contact pads may be dependent on emitter structure and size. U.S. Pat. No. 8,368,100 to Donofrio, et al., entitled "Semiconductor Light Emitting Diodes Having Reflective Structures and Methods of Fabricating Same", also assigned to Cree Inc. and fully incorporated herein by reference, further discloses various contact structures.

FIG. 11 is a graph that shows exemplary efficiency gains of an emitter with the use of current flow control mechanisms described in this disclosure, including a non-uniform via geometry, in comparison with a substantially similar emitter with a uniform via geometry. As seen, a non-uniform via structure provides efficiency gains at all currents, and this gain increases as current increases. A non-uniform via structure may include variations in via size, via density, via material, or even via shape. For example some vias may be circular or round, whereas others may be ovals, elongated circles, squares, cross patterns, semi circles, or any other shape. In other embodiments, different materials or dopants may be used in various vias to impact resistivity and therefore current flow and crowding.

FIG. 12 shows an embodiment of an LED chip 1200 according to the present disclosure that has a non-uniform via structure. FIG. 12 is a cross-section of a device and therefore a full view of the various vias is not apparent. The chip is flip-chip mounted onto a submount or substrate for use. The LED chip may have many layers, including an active structure 1202 comprising a p-type layer 1204, a n-type layer 1206 and an active layer 1208. A thin ITO current spreading layer 1210 is included on the p-type layer 1204 to spread current to the p-type layer 1204 during operation. Some embodiments of current spreading layers comprising ITO, can have thicknesses less than 1000 angstroms (Å), while other embodiments can have a thickness less than 700 Å. Still other embodiments can have a thickness less than 500 Å. Still other embodiments can have a thickness in the range of 50 Å to 300 Å, with some of these embodiments having current spreading layers with a thickness of approximately 200 Å. The current spreading layer, as well as the reflective layers described below can be deposited using known methods. It is understood that in embodiments where current spreading is not a concern, the LED chips can be provided without a current spreading layer. It is also understood that current spreading layers may comprise many different suitable materials, with ITO being one example of a suitable material.

An active structure hole 1212 is included through the current spreading layer 1210 and the p-type layer 1204. A passivation layer 1214 is included on the current spreading layer and the side surfaces of the active structure hole 1212 and n-contact via or contact 1216 is included in the active structure hole for applying an electrical signal to the n-type layer 1206.

In this embodiment, the passivation layer 1214 and the current spreading layer 1210 extend beyond the edge of the active structure 1202 to form a mesa where a p-contact 1218 can be formed on the current spreading layer 1210. An electrical signal applied to the p-contact 1218 is conducted to the p-type layer through the current spreading layer 1210. Accordingly, an electrical signal applied across the p-contact 1218 and the n-contact/via 1216 is conducted to the p-type layer 1204 and n-type layer 1206, causing the active layer 1208 to emit light.

FIG. 12 shows two visible n-contact vias 1216. As it can be seen, these are not uniform in size or spacing, thereby, influencing or forcing current to flow more or less easily along certain paths to create a more efficient or uniform output from the LED chip 1200.

The growth substrate for LED chip 1200 has been removed, and the top surface of the n-type layer is textured for light extraction, though this is not necessary in all embodiments. To provide mechanical stabilization, the LED chip 1200 is flip-chip mounted to a silicon (Si) submount/substrate 1220, with a bond metal layer 1222 and blanket mirror 1224 between the substrate 1220 and the active structure 1202. The blanket mirror 1224 can be made of many different materials, with a suitable material being Al. The blanket mirror 1224 helps to reflect LED light, such as back reflected light or light that passes through the active structure hole 1212.

Figure 13:
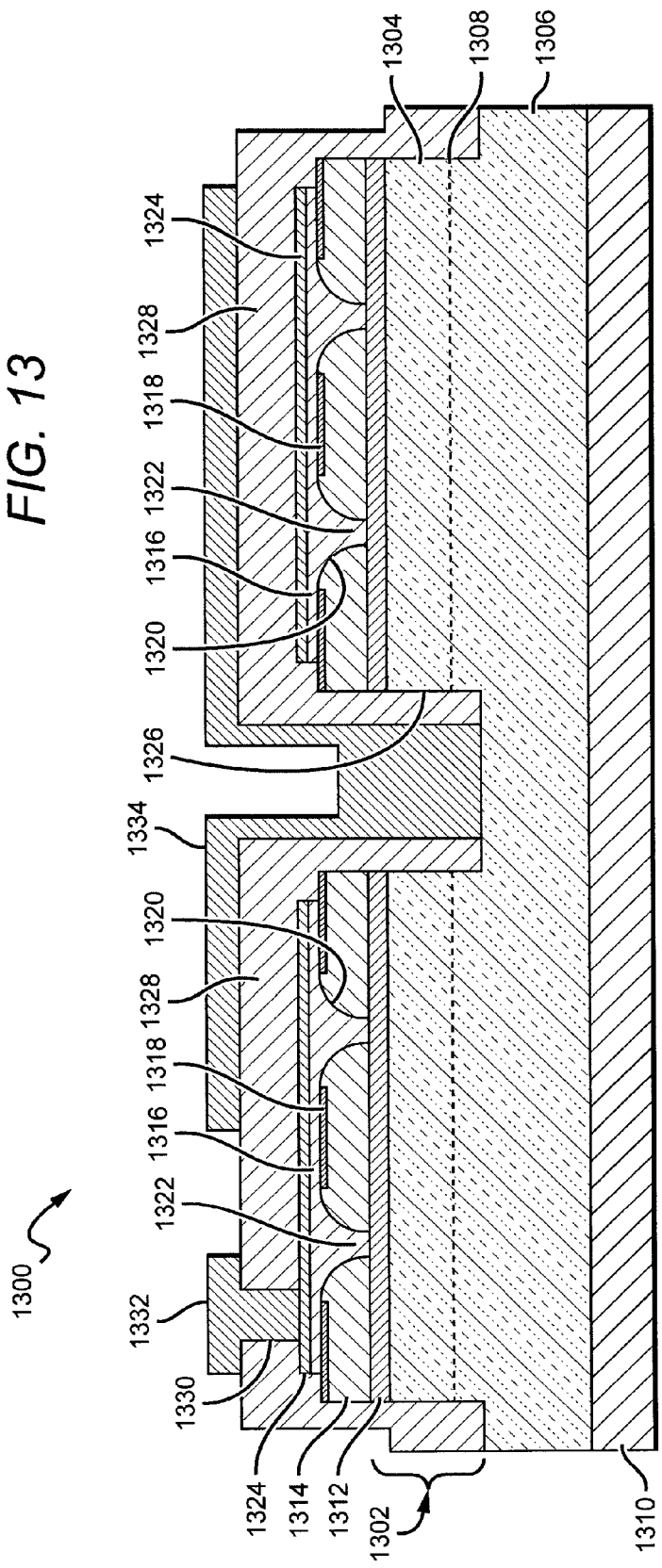
FIG. 13 is a sectional view of another embodiment of an LED chip according to the present disclosure.

FIG. 13 shows an embodiment of an exemplary LED chip 1300 according to the present disclosure that has a non-uniform via structure. FIG. 13 is a cross-section of a device and therefore a full view of the various vias is not apparent. The device may include multiple reflective portions in conjunction with contacts or separate from the contacts. Similar reflective layers are described in commonly owned U.S. patent application Ser. No. 13/909,927 to Sten Heikman, et al., entitled "Light Emitting Diode Dielectric Mirror", filed on Jun. 4, 2013, and incorporated by reference entirely herein. These internal or integral reflective layers can reduce optical emission losses that can occur by light being emitted in an undesirable direction where it can be absorbed. LEDs with enhanced reflectivity structures are also described in commonly owned U.S. application Ser. No. 14/185,589 to Bergmann, et al., entitled "LED Structure With Enhanced Mirror Reflectivity", incorporated by reference entirely herein.

Different embodiments of emitters according to the present disclosure can also utilize other structures, layers or features that allow for efficient and reliable LED operation. In some embodiments, a current spreading layer can be included proximate to the reflective layer to provide for spreading of current into the one or more layers of the active LED structure. In other embodiments, materials can be included to provide for reliable adhesion between different layers. Different embodiments of the disclosure may also have conductive via or path arrangements that provide conductive paths through the reflective layers to the p-layer, for example. This via arrangement can take many different shapes and sizes as described in detail herein. Additionally, though particular emitter structures are shown with the use of non-uniform vias, it should be understood that other emitter structures may be used with the concepts of non-uniform via structures as described herein.

It is understood that the reflective layer arrangements described herein can be used in many different LED chips according to the present disclosure. FIG. 13 shows another embodiment of an LED chip according to the present disclosure, which may have a non-uniform via structure; however, unlike FIG. 12, this chip has a lateral geometry and is arranged for flip-chip mounting. The LED chip 1300 comprises a GaN active structure 1302 having a p-type layer 1304, n-type layer 1306 and an active layer 1308 formed on a substrate 1310. The substrate 1310 can comprise many different materials, such as silicon carbide or sapphire, and can be shaped or textured to enhance light extraction, such as the substrate shaping utilized in the commercially available DA line of LEDs from Cree, Inc.

The LED chip 1300 also comprises a current spreading layer 1312 that is on the p-type layer 1304. In LED chip 1300, the current spreading layer 1312 can comprise ITO and is on the p-type layer 1304 to spread current into the p-type layer 1304. A low index of refraction (IR) reflective layer 1314 is arranged on the current spreading layer 1312. In LED chip 1300 the reflective layer can comprise SiO2, for example. A metal layer 1316 and adhesion layer 1318 are included on the reflective layer 1314, with the adhesion layer 1318 sandwiched between and providing adhesion between the metal layer 1316 and reflective layer 1314. These layers can comprise the same material and can have the same thickness as the metal layer 1316 and adhesion layer 1318 described above.

The LED chip 1300 further comprises reflective layer holes 1320 that can pass through the adhesion layer 1318 and the reflective layer 1314, to the current spreading layer 1312. The holes 1320 can then be filled when the metal layer 1316 is deposited, the metal layer material can form vias 1322 to the current spreading layer. As described in more detail below, the vias 1322 provide a conductive path through the reflective layer, between the p-contact and the current spreading layer 1312.

The holes 1320 can be formed using many known processes such as conventional etching processes or mechanical processes such as microdrilling. The holes 1320 can have many different shapes and sizes, with the holes 1320 in the embodiment shown having angled or curved side surfaces and a circular cross-section with a diameter of less than 20 µm. In some embodiments, the holes can have a diameter of approximately 8 µm, with others having a diameter down to 1 µm. As shown, the vias 1322 do not have uniform sizes. Adjacent holes 1320 can be less than 100 µm apart, with the embodiment shown having a spacing of 30 µm from edge to edge; however, other embodiments may have non-uniform spacing. In still other embodiments, the vias can have a spacing of as low as 10 µm or less. It is understood that the holes 1320 (and resulting vias 1322) can have cross-sections with different shapes, such as square, rectangular, oval, hexagon, pentagon, etc. In other embodiments, the holes are not uniform in size and shape and there can be different or non-uniform spaces between adjacent holes.

In other embodiments, different structures can be used to provide a conductive path between the p-contact and the current spreading layer. Instead of holes, an interconnected grid can be formed through the reflective layer 1314, with a conductive material then being deposited in the grid to form the conductive path through the composite layer. The grid can take many different forms, with portions of the grid having different thicknesses or non-uniform spacing, and interconnecting at different angles in different embodiments. An electrical signal applied to the grid can spread throughout and along the interconnected portions. It is further understood that in different embodiments, a grid can be used in combination with holes, while other embodiments can provide other conductive paths. In yet other embodiments, such a grid may be used to contact n-type layers as well. In some embodiments, one or more conductive paths can run outside the active layer such as along a side surface of the LED chip.

The LED chip 1300 can also comprise a barrier layer 1324 on the metal layer 1316 to prevent migration of the metal layer material to other layers. Preventing this migration helps the LED chip 1300 maintain efficient operation through its lifetime.

An active structure hole 1326 can be included passing through the adhesion layer 1318, reflective layer 1314, and p-type layer 1304, to expose the n-type layer 1306. Though only a single hole is shown, it is understood that a plurality are formed, but not shown in this cross-section. A passivation layer 1328 is included on the barrier layer and the side surfaces of the active structure hole 1326. The passivation layer protects and provides electrical insulation between the contacts and the layers below as described in more detail below. The passivation layer can comprise many different materials, such as a dielectric material.

Passivation layer hole 1330 can be formed through the passivation layer 1328 to the barrier layer 1324 and/or the metal layer 1316. A p-contact 1332 can then be deposited in the passivation layer hole 1330, with the p-contact 1332 providing an electrical signal that can pass to the p-type layer 1304. An electrical signal applied to the p-contact passes through the barrier layer 1324, through the vias 1322, and to the current spreading layer 1312 through which it is spread to the p-type layer 1304. Similarly, an re-contact and n-contact via is formed on the passivation layer and through the active structure hole 1326, with the n-contact 1334 providing an electrical path for an electrical signal to be applied to the n-type layer 1306. As described above, this n-contact and via 1334 exists in a plurality, which is not shown, and this plurality is non-uniform, comprising different sizes, shapes, and/or proximities. A signal applied across the p-contact 1332 and the n-contact 1334 is conducted to the p-type layer 1304 and the n-type layer 1306, causing the LED chip to emit light from its active layer 1308.

The p-contact 1332 and the n-contact 1334 can comprise many different materials, such as Au, copper (Cu) nickel (Ni), indium (In), aluminum (Al), silver (Ag), tin (Sn), platinum (Pt) or combinations thereof. In still other embodiments they can comprise conducting oxides and transparent conducting oxides, such as ITO, nickel oxide, zinc oxide, cadmium tin oxide, indium oxide, tin oxide, magnesium oxide, ZnGa2O4, ZnO2/Sb, Ga2O3/Sn, AgInO2/Sn, In2O3/Zn, CuAlO2, LaCuOS, CuGaO2 and SrCu2O2. The choice of material used can depend on the location of the contacts as well as the desired electrical characteristics, such as transparency, junction resistivity and sheet resistance.

As described above, the LED chip 1300 is arranged for flip-chip mounting. In operation, the p-contact 1332 and n-contact 1334 are bonded to a surface, such as a printed circuit board (PCB), with electrical paths for applying an electrical signal to the LED chip 1300. In most cases, the p-contact 1332 and n-contact 1334 are on the bottom surface, and light that is emitted toward the bottom of the LED chip risks being at least partially absorbed, such as by the PCB. The reflective layer 1314 and metal layer 1316 are arranged below the active layer 1308, so that light emitted toward the bottom is reflected back up to contribute to useful LED chip emission. The reflective layer 1314 reflects most light by TIR, with the majority of the remainder of the light being reflected by metal layer 1316.

Figure 14:
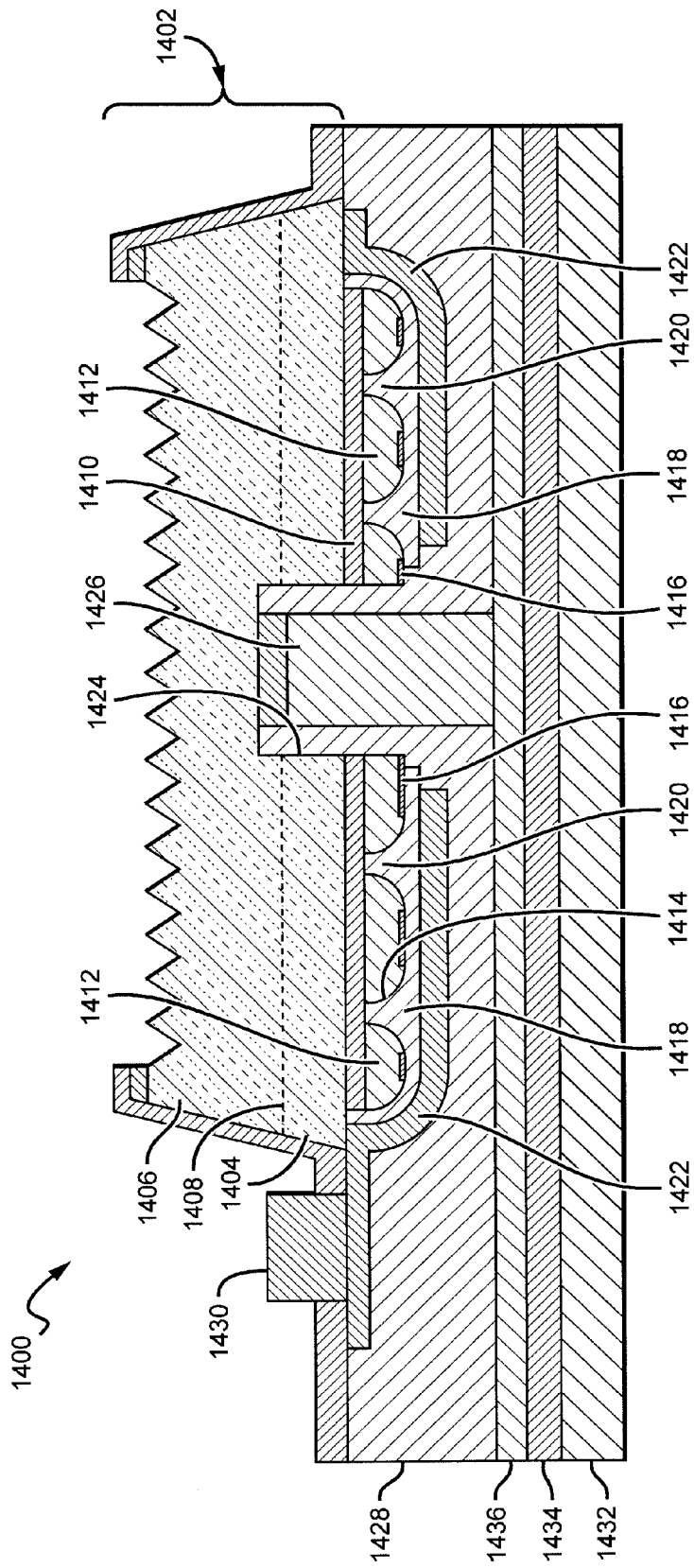
FIG. 14 is a sectional view of another embodiment of an LED chip according to the present disclosure.

FIG. 14 shows a cross-section of an LED chip 1400, which has a non-uniform via structure. The structure of the LED chip 1400 is similar to that of the chip 1200 shown in FIG. 12; however, it also includes the additional reflector structure shown in FIG. 13. As stated previously, though only a limited number of vias 1420 and 1426 are shown, it is understood that a plurality of vias exist, which are not shown, and these are disposed to be non-uniform in size, shape, and/or distribution.

The LED chip has many layers similar to those in the embodiment shown in FIGS. 12 and 13 and described above, including an active structure 1402 comprising a p-type layer 1404, a n-type layer 1406 and an active layer 1408. A thin ITO current spreading layer 1410 is included on the p-type layer 1404 to spread current to the p-type layer 1404 during operation. A reflective layer 1412 is included on the current spreading layer as described above, with the SiO2 reflective layer embodiments providing an IR (index of refraction) step with the active structure 1402 to promote TIR (total internal reflection). A metal layer 1418 is included on the reflective layer 1412 with a TiON adhesion layer between the two.

Reflective layer holes 1414 can be formed through the adhesion layer 1416 and the reflective layer 1412, with the metal layer 1418 material forming vias 1420 though the reflective layer 1412. A barrier layer 1422 is included on the metal layer 1418 to prevent migration of metal layer materials, as described above. An active structure hole 1424 is included through the adhesion layer 1416, reflective layer 1412, current spreading layer 1410 and the p-type layer 1404. A passivation layer 1428 is included on the barrier layer and the side surfaces of the active structure hole 1424 and n-contact via 1426 is included in the active structure hole for applying an electrical signal to the n-type layer 1406.

In this embodiment, the passivation layer 1428 and the barrier layer 1422 extend beyond the edge of the active structure 1402 to form a mesa where a p-contact 1430 can be formed on the barrier layer 1422. An electrical signal applied to the p-contact 1430 is conducted to the p-type layer through the barrier layer 1422, reflective layer 1412 and the current spreading layer 1410. Accordingly, an electrical signal applied across the p-contact 1430 and the n-contact/via 1420 is conducted to the p-type layer 1404 and n-type layer 1406, causing the active layer 1408 to emit light. Thereby, changes in the via structures 1426, 1420 can impact current crowding and flow in order to increase efficiency and/or uniformity.

The growth substrate for LED chip 1400 has been removed, and the top surface of the n-type layer is textured for improved light extraction. To provide mechanical stabilization, the LED chip 1400 is flip-chip mounted to a silicon (Si) submount/substrate 1432, with a bond metal layer 1434 and blanket mirror 1436 between the substrate 1432 and the active structure 1402. The blanket mirror 1436 can be made of many different materials, with a suitable material being Al. The blanket mirror 1436 helps to reflect LED light that escapes reflection by the reflective layer 1412 and the metal layer 1418, such as light that passes through the active structure hole 1424.

The reflective layer 1412 and the metal layer 1418 are arranged between the active structure 1402 and the substrate 1432 so that light emitted by the active structure 1402 toward the substrate 1432 can be reflected back to contribute to useful LED light emission. This reduces the amount of light that can be absorbed by structures, such as the submount 1432, with the embodiments according to present disclosure promoting reflection by TIR instead of reflection off metal layers, to further reduce light loss due to absorption.

Each of the LEDs in the chips discussed herein can have first and second contacts. In some of the embodiments shown, the LEDs have lateral geometry, as such, the LED can be contacted from one side or surface of the LED, instead of top and bottom surfaces, as is the case for vertical geometry. Regardless of geometry, the first and second contacts can comprise many different materials, such as gold (Au), copper (Cu) nickel (Ni), indium (In), aluminum (Al), silver (Ag), or combinations thereof. Still other embodiments can comprise conducting oxides and transparent conducting oxides, such as indium tin oxide, nickel oxide, zinc oxide, cadmium tin oxide, titanium tungsten nickel, indium oxide, tin oxide, magnesium oxide, $ZnGa_2O_4$, $ZnO_2$/Sb, $Ga_2O_3$/Sn, $AgInO_2$/Sn, $In_2O_3$/Zn, $CuAlO_2$, $LaCuOS$, $CuGaO_2$ and $SrCu_2O_2$. The choice of material used can depend on the location of the contacts, as well as the desired electrical characteristics, such as transparency, junction resistivity and sheet resistance.

Some embodiments of LED chips according to the present disclosure can have other features, and Group-III nitride based LEDs, for example, can have other features to assist in spreading current from the contacts. This is particularly applicable to spreading current into p-type Group-III nitrides and the current spreading structure can comprise thin semitransparent current spreading layer covering some or the entire p-type layer. These layers can comprise different materials, including but not limited to a metal, such as platinum (Pt) or a transparent conductive oxide, such as indium tin oxide (ITO).

Figure 15:
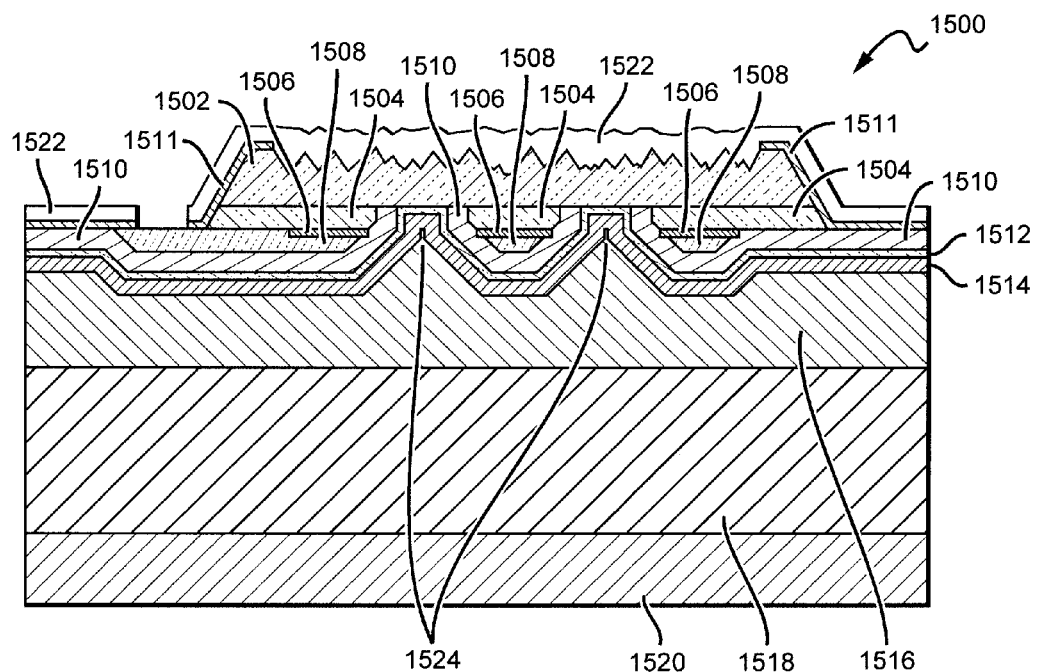
FIG. 15 is a sectional view of another embodiment of an LED chip according to the present disclosure.

FIG. 15 is a cross section of another embodiment of an LED chip 1500 with a non-uniform via structure. The chip 1500 may comprise some or all of the components, as discussed with the other chip embodiments. Chip 1500 has n-contact vias 1524. The vias 1524 allow for the removal of the n-contact metal on the topside of the device, and the n-contact is essentially embedded within the device and electrically accessible from the bottom of the chip. With less topside metal to block light emission, improved brightness can be realized. Furthermore, the barrier metal outside the periphery of the mirror is eliminated and/or substantially reduced, which further contributes to the emission efficiency of the device.

The vias 1524, according to the present disclosure can be formed using conventional methods, such as etching to form the openings for the vias and photolithographic processes for forming the via. The vias take only a fraction of the area on the LED chip that would be needed for a wire bond pad. By using one or more vias in place of a wire bond pad, less of the active area is removed. Also, fewer sections of emission blocking metal for contacts are located on the topside of the device. This leaves more LED active area for light emission, thereby increasing the overall efficiency of the LED chip.

Two vias 1524 are shown in the cross-section. As can be seen, the vias structure is non-uniform, with the vias being different sizes. Though only two vias are shown, it is understood that others may be disposed in the device, which are not visible. Also, it is understood that the non-uniformity of the via structure may also or instead be related to the configuration in which the vias are dispersed. It is also understood that different embodiments can have more or less vias, and the vias can be in many different locations. In those embodiments having multiple vias, the vias can have different shapes and sizes and can extend to different depths in the LED. It is also understood that different embodiments can also comprise vias used in place of the first wire bond pad.

FIG. 15 may further include a roughened n-GaN layer 1502, p-GaN layers 1504, mirror layers 1506 (which may also serve as the p-contact for the LED), barrier layers 1508, passivation layers 1510, 1511, an n-contact 1512, barrier layer 1514, a bond metal layer 1516, a carrier layer 1518, AuSn layer 1520, and passivation layer 1522. As discussed above, the roughened layers assist with improved light extraction of the device; however, other embodiments may not include these.

As with some other embodiments, the barrier layers 1508 may be sized such that they are smaller than the mirror layers 1506 and/or are prevented from extending beyond 40% or more of the periphery of the mirrors 1506. The barrier layers 1508 may be further provided to form a contact at the topside of the device for the p-contact integral to at least a portion of mirrors 1506. Furthermore, the barrier layers 1508 may help spread current laterally through the device, since the mirrors 1506 may be too thin to effectively spread current.

The barrier layer 1514 may be provided as a protective layer for n-contact 1512, such that bond metal layer 1516 is isolated from n-contact 1512 and thus does not dissolve into or otherwise adversely react with re-contact 1512. Barrier layer 1514 may comprise TiW/Pt, although it is understood that other suitable materials are contemplated. In some embodiments, barrier layer 1514 may not be necessary depending on the material make-up of the n-contact 1512 and bond metal layer 1516. The n-contact may be comprised of a variety of suitable materials, with preferred materials being reflective to further enhance the light emission of the device. As such, n-contact 1512 may be comprised of Al, Ag, or other reflective materials. Bond metal layer 1516 may further be reflective.

Passivation layers 1511 are disposed on the sidewalls of the active region, providing sidewall passivation as is well known in the art. Passivation layers 1510, 1511 may comprise SiN, which exhibits favorable moisture resistive characteristics. However, it is understood that other suitable materials are also contemplated. Passivation layer 1522 may also be disposed over the device, as shown to provide physical protection to the underlying components. Passivation layer 1522 may be comprised of $SiO_2$, but it is understood that other suitable passivation materials are also contemplated.

Figure 16:
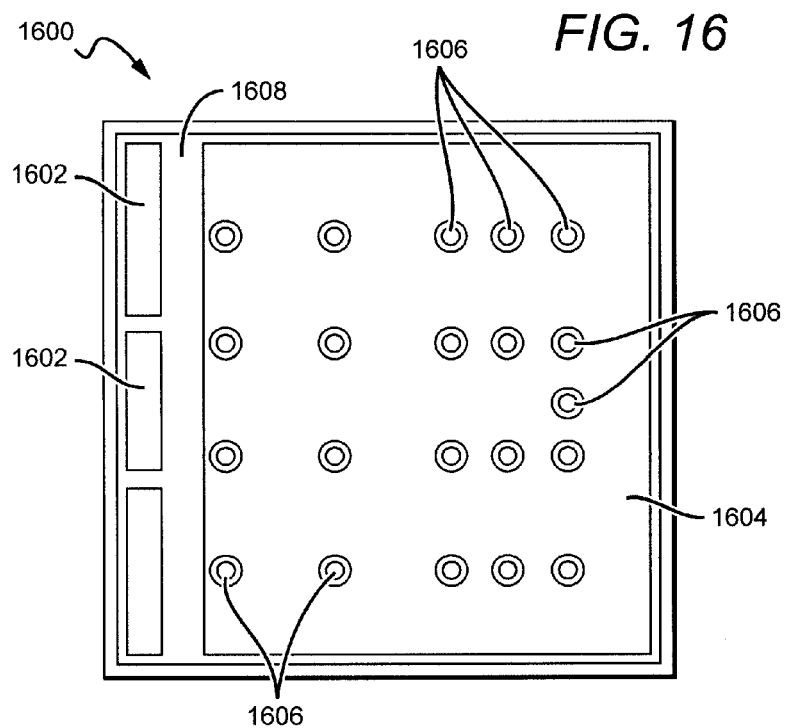
FIG. 16 is a top view of an LED and via structure according to another embodiment of the present disclosure.

FIG. 16 is a top view of an LED 1600 and via structure according to another embodiment of the present disclosure. This embodiment shows an anode pad 1602 and the cathode pad 1604 thereon. Though the anode pad 1602 is shown as three separate segments, it should be understood that this may also be a single pad in other embodiments. In yet other embodiments, the anode pad may include any number of pads, and may also be arranged in various areas on the LED, rather than on one side as shown in the figure, including on opposing sides. The cathode pad 1604 may also have alternate arrangements, such as a variety of separate segments or locations. The diode region has been etched to reach the n-type layer (not illustrated in FIG. 16), and to also define the vias 1606. A passivation layer may then be deposited and etched to expose the n-type region on the floor of the via 1606 and a portion of the barrier. The gap 1608 may be filled with a gap filling layer, which may comprise polyimide, for example.

FIG. 16 shows an embodiment of an LED having reflective anode contacts, so that the entire surface may be reflective except for where the barriers are directly on the diode region. Thus, in embodiments of FIG. 16, the entire structure has a mirror, except for the region immediately surrounding where the vias 1606 are.

As shown, the vias 1606 have a non-uniform structure, such that they are not equally spaced apart, but instead there is a more dense dispersion in some areas. It is understood that these vias may also have different sizes.

It is understood that many different materials can be used in the different features in the embodiments according to the present disclosure, and that the features can be arranged in many different ways beyond the embodiments above. In some embodiments, vias may be placed in different locations, incorporate other sizes, and be depicted differently. The fabrication of such devices can be somewhat more complex.

It is understood that embodiments presented herein are meant to be exemplary. Embodiments of the present disclosure can comprise any combination of compatible features shown in the various figures, and these embodiments should not be limited to those expressly illustrated and discussed.

Although the present invention has been described in detail with reference to certain preferred configurations thereof, other versions are possible. Therefore, the spirit and scope of the invention should not be limited to the versions described above.

We claim:

1. A light emitting diode (LED) chip, comprising:
   an active LED structure comprising an active layer between two oppositely doped epitaxial layers, and said active layer emitting light in response to an electrical signal applied to said oppositely doped layers; and
   a plurality of non-uniform vias providing an electrical path to at least one of said oppositely doped layers, wherein said non-uniform vias protrude into at least one of said oppositely doped epitaxial layers.

2. The LED chip of claim 1, wherein said non-uniform vias have different sizes.

3. The LED chip of claim 1, wherein said non-uniform vias have different shapes.

4. The LED chip of claim 1, wherein said non-uniform vias comprise different materials.

5. The LED chip of claim 1, wherein said non-uniform vias are spaced apart at different intervals.

6. The LED chip of claim 1, wherein said LED chip has improved efficiency compared to an LED chip constructed in the same manner with a plurality of uniform vias.

7. The LED chip of claim 1, wherein said oppositely doped epitaxial layers comprise a n-type layer and a p-type layer and wherein said non-uniform vias protrude through said p-type layer providing an electrical path to said n-type layer.

8. The LED chip of claim 1, wherein said oppositely doped epitaxial layers comprise a n-type layer and a p-type layer, and said LED chip further comprises a second plurality of non-uniform vias in contact with said p-type layer.

9. The LED chip of claim 1, further comprising a current spreading layer on at least one of said oppositely doped epitaxial layers, wherein said current spreading layer has a non-uniform thickness.

10. The LED chip of claim 1, further comprising an at least one contact pad.

11. The LED chip of claim 10, wherein said non-uniform vias increase in size in relation to distance from said at least one contact pad.

12. The LED chip of claim 10, wherein the interval between said non-uniform vias decreases in relation to distance from said at least one contact pad.

13. The LED chip of claim 1, further comprising a plurality of contact pads arranged to increase current flow uniformity across said LED chip.

14. The LED chip of claim 1, further comprising a plurality of contact pads, wherein an at least one of said contact pads is arranged proximate to three different corners of said LED chip.

15. The LED chip of claim 1, wherein said LED chip comprises a multi-junction chip and said plurality of non-uniform vias are arranged to increase current flow along the edges of bordering junctions.

16. The LED chip of claim 1, wherein said plurality of non-uniform vias increases current flow to at least an edge of said LED chip.

17. The LED chip of claim 1, wherein said plurality of non-uniform vias are between a substrate and said active layer.

18. The LED chip of claim 1, wherein said plurality of non-uniform vias are on a side of said active layer opposite a substrate.

19. A light emitting diode (LED) chip, comprising:
   an active region comprised of an n-type layer and a p-type layer; and
   a plurality of non-uniform vias protruding through said p-type layer and in electrical contact with said n-type layer.

20. The LED chip of claim 19, wherein said non-uniform vias are electrically isolated from said p-type layer.

21. The LED chip of claim 19, wherein said non-uniform vias have different sizes.

22. The LED chip of claim 19, wherein said non-uniform vias have different shapes.

23. The LED chip of claim 19, wherein said non-uniform vias are spaced apart at different intervals.

24. The LED chip of claim 19, wherein said non-uniform vias comprise different materials.

25. The LED chip of claim 19, wherein said LED chip has improved efficiency compared to an LED chip constructed in the same manner with a plurality of uniform vias.

26. The LED chip of claim 19, further comprising a second plurality of non-uniform vias in contact with said p-type layer.

27. The LED chip of claim 19, further comprising an at least one contact pad.

28. The LED chip of claim 27, wherein a first via of said plurality of non-uniform vias, which is closer to said at least one contact pad, is smaller in size than a second via, which is further from said at least one contact pad.

29. The LED chip of claim 27, wherein the interval between a first two adjacent vias of said plurality of non-uniform vias is larger than the interval between a second two adjacent vias, wherein said first two adjacent vias are closer to said at least one contact pad than said second two adjacent vias.

30. The LED chip of claim 19, further comprising a plurality of contact pads arranged to increase current flow uniformity across said LED chip.

31. The LED chip of claim 19, wherein said plurality of non-uniform vias increases current flow to at least an edge of said LED chip.

32. The LED chip of claim 19, wherein said plurality of non-uniform vias increases current flow to at least the center of said LED chip.

33. A light emitting diode (LED) chip, comprising:
   a multi-junction LED structure comprising an active layer between two oppositely doped epitaxial layers, said active layer emitting light in response to an electrical signal applied to said oppositely doped layers; and
   a plurality of vias providing an electrical path to at least one of said oppositely doped, wherein at least a portion of said plurality of vias are non-uniform.

34. The LED chip of claim 33, wherein said plurality of non-uniform vias increase current flow along an edge of a first junction of said multi-junction LED structure, wherein said edge is adjacent to a second junction of said multi-junction LED structure.

35. The LED chip of claim 33, wherein said plurality of vias is non-uniform within at least one of said junctions of said multi-junction LED structure.

36. The LED chip of claim 33, wherein said plurality of vias of a first junction of the multi-junction LED structure are non-uniform with respect to vias of a second junction of said multi-junction LED structure.

\* \* \* \* \*